(12) United States Patent
Goela et al.

(10) Patent No.: US 7,722,441 B2
(45) Date of Patent: May 25, 2010

(54) SEMICONDUCTOR PROCESSING

(75) Inventors: Jitendra S. Goela, Andover, MA (US); Michael A. Pickering, Dracut, MA (US); James T. Fahey, Mendon, MA (US); Melinda S. Strickland, Hillsboro, OR (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 62 days.

(21) Appl. No.: 11/544,223

(22) Filed: Oct. 6, 2006

(65) Prior Publication Data

US 2007/0084827 A1    Apr. 19, 2007

Related U.S. Application Data

(60) Provisional application No. 60/724,970, filed on Oct. 7, 2005.

(51) Int. Cl.
*B24B 1/00* (2006.01)
(52) U.S. Cl. .................... 451/63; 428/848.1
(58) Field of Classification Search ............ 451/41, 451/28, 51, 54, 57, 63; 428/848.2; 118/715, 118/728, 500
See application file for complete search history.

(56) References Cited

U.S. PATENT DOCUMENTS

| | | | |
|---|---|---|---|
| 3,398,033 A | 8/1968 | Haga et at | |
| 3,965,567 A | 6/1976 | Beerwerth et al. | |
| 4,263,336 A | 4/1981 | Thompson et al. | |
| 4,496,609 A | 1/1985 | McNeilly et al. | |
| 4,698,486 A | 10/1987 | Sheets | |
| 4,735,920 A | 4/1988 | Stephani et al. | |
| 4,865,685 A | 9/1989 | Palmour | |
| 4,925,608 A | 5/1990 | Rossi et al. | |
| 4,997,678 A | 3/1991 | Taylor et al. | |
| 5,011,794 A | 4/1991 | Grim et al. | |
| 5,084,071 A | 1/1992 | Nenadic et al. | |
| 5,227,034 A | 7/1993 | Stein et al. | |
| 5,336,355 A | 8/1994 | Zarowin et al. | |
| 5,354,580 A | 10/1994 | Goela et al. | |
| 5,374,412 A | 12/1994 | Pickering et al. | |
| 5,407,750 A | 4/1995 | Kinoshita et al. | |
| 5,417,803 A | 5/1995 | Goldstein et al. | |
| 5,427,622 A | 6/1995 | Stanasolovich et al. | |
| 5,431,561 A | 7/1995 | Yamabe et al. | |
| 5,474,613 A | 12/1995 | Pickering et al. | |
| 5,584,898 A | 12/1996 | Fulton | |
| 5,584,936 A | 12/1996 | Pickering et al. | |

(Continued)

FOREIGN PATENT DOCUMENTS

EP    0 935 013 B1    11/2001

(Continued)

OTHER PUBLICATIONS

Kiely, et al., "Quantification of topographic structure by scanning probe microscopy", American Vacuum Society, Apr. 1997, pp. 148311493.

(Continued)

*Primary Examiner*—Robert Rose
(74) *Attorney, Agent, or Firm*—John J. Piskorski

(57) ABSTRACT

Semiconductor processing and equipment are disclosed. The semiconductor equipment and processing provide semiconductor wafers with reduced defects.

8 Claims, 2 Drawing Sheets

U.S. PATENT DOCUMENTS

| | | | |
|---|---|---|---|
| 5,750,434 A | 5/1998 | Urushidani et al. | |
| 5,789,309 A | 8/1998 | Hellwig | |
| 5,800,618 A | 9/1998 | Niori et al. | |
| 5,865,321 A | 2/1999 | Tomanovich | |
| 5,882,807 A | 3/1999 | Funato et al. | |
| 5,895,583 A | 4/1999 | Augustine et al. | |
| 5,904,778 A | 5/1999 | Lu et al. | |
| 5,951,774 A * | 9/1999 | Shishiguchi et al. | 118/725 |
| 6,013,236 A | 1/2000 | Takahashi et al. | |
| 6,086,680 A | 7/2000 | Foster et al. | |
| 6,099,650 A | 8/2000 | Carbonaro et al. | |
| 6,127,068 A | 10/2000 | Shoki et al. | |
| 6,129,787 A | 10/2000 | Adachi et al. | |
| 6,174,366 B1 | 1/2001 | Ihantola | |
| 6,251,150 B1 | 6/2001 | Small et al. | |
| 6,284,039 B1 | 9/2001 | Mule'Stagno et al. | |
| 6,300,226 B1 | 10/2001 | Miyata et al. | |
| 6,368,410 B1 | 4/2002 | Gorczyca et al. | |
| 6,454,865 B1 | 9/2002 | Goodman et al. | |
| 6,454,866 B1 | 9/2002 | Halpin et al. | |
| 6,464,912 B1 | 10/2002 | Goela et al. | |
| 6,506,254 B1 | 1/2003 | Bosch et al. | |
| 6,528,123 B1 | 3/2003 | Cadden et al. | |
| 6,566,623 B2 | 5/2003 | McPhillips | |
| 6,595,506 B1 | 7/2003 | Zide et al. | |
| 6,608,287 B2 | 8/2003 | Halpin et al. | |
| 6,617,244 B2 | 9/2003 | Nishizawa | |
| 6,648,977 B2 | 11/2003 | Goela et al. | |
| 6,649,497 B2 | 11/2003 | Ring | |
| 6,663,674 B2 | 12/2003 | Tucker et al. | |
| 6,692,576 B2 | 2/2004 | Halpin et al. | |
| 6,706,205 B2 | 3/2004 | Gorczyca et al. | |
| 6,770,568 B2 | 8/2004 | Brask | |
| 6,781,506 B2 | 8/2004 | Schemenaur et al. | |
| 6,818,310 B2 | 11/2004 | Namiki et al. | |
| 6,834,613 B1 | 12/2004 | Miyazaki et al. | |
| 6,872,636 B2 | 3/2005 | Moriya et al. | |
| 6,884,464 B2 | 4/2005 | Luo et al. | |
| 6,890,861 B1 * | 5/2005 | Bosch | 438/706 |
| 6,893,507 B2 | 5/2005 | Goodman et al. | |
| 6,919,278 B2 | 7/2005 | Kang et al. | |
| 7,582,166 B2 * | 9/2009 | Lampe et al. | 118/728 |
| 2003/0190870 A1 | 10/2003 | Shih et al. | |
| 2004/0040632 A1 | 3/2004 | Oosterlaken | |
| 2004/0060512 A1 * | 4/2004 | Waldhauer et al. | 118/715 |
| 2004/0089236 A1 | 5/2004 | Yokogawa et al. | |
| 2004/0238487 A1 | 12/2004 | Kiehlbauch et al. | |
| 2004/0244685 A1 | 12/2004 | Ricci et al. | |
| 2005/0166848 A1 * | 8/2005 | Natsuhara et al. | 118/728 |
| 2005/0181617 A1 | 8/2005 | Bosch | |

FOREIGN PATENT DOCUMENTS

| | | |
|---|---|---|
| EP | 0 892 083 B1 | 3/2003 |
| JP | 2005064392 | 3/2005 |
| WO | WO 02/03427 A2 | 1/2002 |
| WO | WO 2004/014607 A1 | 2/2004 |
| WO | WO 2004/025708 | 3/2004 |
| WO | WO 2005/070851 A1 | 4/2005 |

OTHER PUBLICATIONS

Northern Lights Optics (optical design for amateur telescope makers), http://www.minerals.sk.ca/atm_design/materials/silicon_carbide.html, Aug. 16, 2004.

"Surface Texture (surface roughness waviness, and lay)", The American Society of Mechanical Engineers, ASME B46.1-2002, Revision of ASME B46.1-1995, issued 2003.

Product Overview: SIRD Metrology System (Scanning infrared depolarization tool for monitoring of process related stress in wafers); PVATePla AG; Hans-Riedl-Strasse5; www.pvatepla.com, 2004.

Product Overview: Surfscan SP1 (Unpatterned surface inspection system); KLA-Tencor Corporation, http://www@kla-tencor.com, 1998.

European Search Report of corresponding European Application No. EP 6 25 5157 mailed Mar. 3, 2009.

* cited by examiner

SEMICONDUCTOR PROCESSING

The present invention is directed to semiconductor wafer processing to provide semiconductor wafers having reduced defects. More specifically, the present invention is directed to semiconductor wafer processing to provide semiconductor wafers having reduced defects processed in wafer holding articles with reduced surface roughness.

One of the problems associated with processing semiconductor wafers is that the wafers typically form defects known as slip. Slip is a dislocation of molecules along crystallographic planes formed when parts of a single crystal move relative to each other along these planes. This movement may occur when there is less than optimum contact between susceptors and wafers. Typically, the slip originates on the backside of the wafer which is in contact with a susceptor surface and then propagates through the wafer during continued processing. There can be many causes of slip, but a fundamental problem is small area (sharp point) contact on the surface that causes a high localized stress when the wafer is placed on a surface or moves on a surface. Thus, it is important to produce a surface that is free of sharp objects or protrusions and to provide edges that are rounded. The less than optimum contact is often due to the rough surface topography of the ceramic material from which the susceptor is made. This movement also may occur when the wafer is unevenly heated or cooled during the film forming process, particularly between the top and bottom surfaces of the wafer and at the outer edges where heat is dissipated quicker. Thermal stress is then produced at portions of the wafer where large temperature gradients exist, causing slip when parts of the crystal move to relieve such stress. Wafers having slip defects can lead to undesirable yield loss when used to fabricate semiconductor devices.

Crystallographic slip may, to some degree, be reduced by maintaining ideal contact between the wafers and the wafer susceptors, by heating the wafers very slowly, or by making the wafers thicker or smaller in diameter than present conventional wafers. However, such techniques are difficult to implement and utilize in production environments.

One attempt to address the problem of slip is disclosed in U.S. Pat. No. 6,099,650 to Carbonaro et al. Carbonaro addresses the problem of slip by placing a cover over the wafers held in a susceptor in a chemical vapor deposition reactor. According to Carbonaro the cover serves as a heat barrier to radiate and reflect heat from the susceptor onto the wafers. This allegedly prevents heat from being radiated from the wafers, and the temperature gradient across the wafers is reduced, thereby reducing or eliminating slip in the wafers during and after the formation of epitaxial layers. The cover has the same shape and diameter of the susceptor and is composed of graphite with a silicon carbide coating of 0.6 cm to 2.54 cm thick. Varying the thickness allegedly enables controlling the amount of heat radiated from the cover. The cover is placed 0.6 cm to 5 cm above the wafers. Adjusting the distance allegedly enables controlling the amount of heat reflected back on the wafers. This is believed to increase the heat on top of the wafers.

In addition to slip, other problems associated with semiconductor processing include sticktion and float. Sticktion is sticking of the wafer to the susceptor or other wafer holding apparatus. Sticktion is difficult to measure quantitatively, but qualitatively you may notice it when the wafer is lifted from the susceptor. If you experience sticking with stress damage to the wafer, then sticktion is present. Stress damage is observable by crystalline point defects, line defects and fractures in the wafer. Float occurs when the wafer is supported on a few high points on the susceptor surface and trapped gases pass between the susceptor surface and the wafer causing the wafer to move relative to the susceptor. Ideally, both sticktion and float are zero during semiconductor wafer processing and the wafers remain motionless in their holding apparatus. Accordingly, there is a need for improved methods which address the problems discussed above.

In one aspect of the invention there is provided a method including modifying one or more surfaces of a wafer holding article to provide a wafer holding article having a surface of Ra of less than or equal to 3 microns and an Rz(din) of less than or equal to 15 microns; placing one or more semiconductor wafers in the wafer holding article; placing the wafer holding article having the surface of Ra of less than or equal to 3 microns and an Rz(din) of less than or equal to 15 microns with the one or more semiconductor wafers in a processing chamber; and processing the one or more semiconductor wafers to modify the one or more semiconductor wafers to form a modified semiconductor wafer having less than or equal to 50 slip defects.

In another aspect there is provided a method including modifying one or more surfaces of a wafer holding article to provide a wafer holding article having an edge radius of 0.05 mm or more, an Ra of less than or equal to 3 microns and an Rz(din) of less than or equal to 15 microns; placing one or more wafers in the modified wafer holding article; placing the modified wafer holding article having the Ra of less than or equal to 3 microns and an Rz(din) of less than or equal to 15 microns with the one or more semiconductor wafers in a processing chamber; and processing the one or more semiconductor wafers to modify the one or more semiconductor wafers to form a modified semiconductor wafer having less than or equal to 50 slip defects.

In a further aspect a wafer holding article is provided having an Ra of less than or equal to 3 microns and an Rz(din) of less than of equal to 15 microns. The wafer holding article also may have an edge radius of 0.05 or more.

In addition to eliminating or reducing slip, the methods reduce or eliminate the imbalance between sticktion and float.

Figure 1:
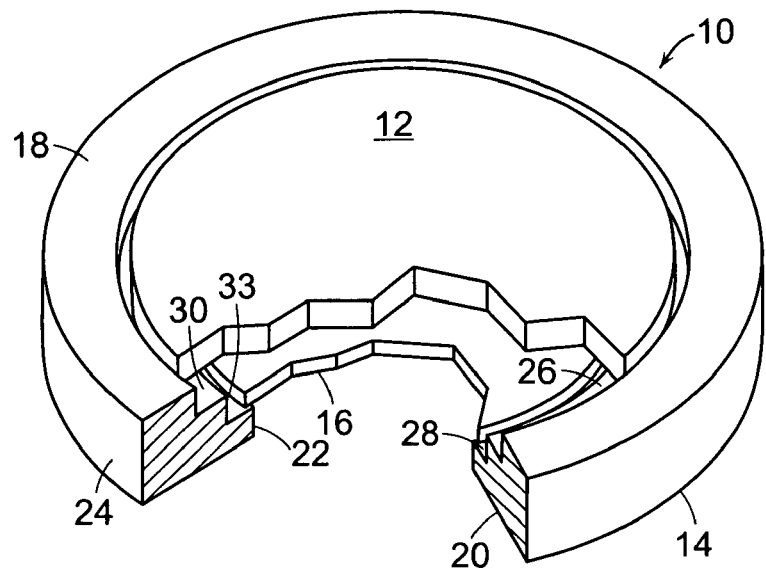
FIG. 1 is a perspective view with partial cut-away showing a susceptor ring.

As used throughout this specification, the following abbreviations shall have the following meanings, unless the context indicates otherwise: ° C.=degrees Centigrade; μm=microns=micrometers; m=meters; cm=centimeter; mm=millimeters; nm=nanometers; A=amperes; mA=milliamperes; CVD=chemical vapor deposition; PVD=physical vapor deposition; ml=milliliters; min=minute; sec=second; msec=millisecond; hr=hour; Hz=hertz; kHz=kilohertz; W=watt=1 joule/second; erg=1 dyne cm=$10^{-7}$ Joules; mV=millivolts; 1 atmosphere=760 torr; 1 atmosphere=$1.01325 \times 10^6$ dynes/cm$^2$; psi=pounds per square inch; 1 atmosphere=14.7 psi; rpm=revolutions per minute; Å=angstroms=$1 \times 10^{-4}$ microns; RMS=root mean square; and SEM=scanning electron microscopy.

All percentages are by weight unless otherwise noted. All numerical ranges are inclusive and combinable in any order, except where it is logical that such numerical ranges are constrained to add up to 100%.

Methods include modifying one or more surfaces of a wafer holding article to provide a wafer holding article having a surface of Ra of less than or equal to 3 microns and an Rz(din) of less than or equal to 15 microns; placing one or more semiconductor wafers in the wafer holding article; placing the wafer holding article having the surface of Ra of less than or equal to 3 microns and an Rz(din) of less than or equal to 15 microns with the one or more semiconductor wafers in a processing chamber; and processing the one or more semiconductor wafers to modify the one or more semiconductor wafers to form a modified semiconductor wafer having less than or equal to 50 slip defects.

In addition to providing reduced slip defects, processing semiconductors in wafer holding apparatus having a surface of Ra less than or equal to 3 microns and an Rz(din) of less than or equal to 15 microns reduces or eliminates the imbalance between sticktion and float.

The roughness of a surface consists of finer irregularities of surface texture and includes Ra and Rz(din). "Ra" refers to the arithmetic average of the absolute values of the profile (peak) height deviations from a mean line recorded within a certain evaluation length (average roughness). Ra ranges from 3 microns or less, or such as from 0.1 microns to 0.001 microns, or such as from 0.01 microns to 0.005 microns. Rz(din) value is the average maximum peak-to-valley height of any five consecutive sampling lengths within the measurement length. The peak-to-valley distance is the distance between the height of a surface feature and a trough or valley in the surface. A "peak" is the point of maximum height on a given portion of the profile that lies above a centerline. A "valley" is a point of maximum depth on a given portion or a profile that lies below a centerline. Rz(din) ranges from 15 microns or less, or such as from 1 micron to 0.005 microns, or such as from 3 microns to 0.05 microns.

A variety of methods may be used to measure the roughness of a surface. One suitable method is an autocovariance function. The two-dimensional autocovariance function is a function of direction and distance and represents the expected value of the height product of all two-point pairs that are separated by certain length in a direction. In other words, the auto covariance function describes the characteristic feature length, i.e. the length between two peaks having a certain height. For a description of the application of an autocovariance function to the determination of surface topography, see Kiely et al., *Quantification of Topographic Structure by Scanning Probe Microscopy, Journal of Vacuum Science Technology B*, vol. 15, no. 4, July/August 1997, pp 1483-1493. Further descriptions of roughness parameters and methods of determining the values of these parameters are provided in Standard ASME B46.1-2002, *Surface texture (Surface Roughness, Wavines and Lay)*, American Society of Mechanical Engineers, 2003. Typically, the directionality surface topography of the surface features are determined using atomic force spectroscopy (AFM) or an optical profilometer.

The wafer holding articles also may have wafer support edges with an edge radius of 0.05 mm or more, or such as from 0.1 mm to 1 mm. The radius is measured from the quarter of the circle, which is a conventional method used in the art. A profilometer may be used to measure the radius or it may be done using a microscope. An edge radius of 0.05 mm or more also reduces or eliminates crystalline point defects, line defects as well as fractures in the wafer caused by stress.

Any suitable ceramic may be used to make the wafer holding articles. Typically, the material used to make the wafer holding articles is silicon carbide. Silicon carbide may be made by many different methods resulting in silicon carbides having different and distinct properties such as thermal conductivity, electrical resistivity, density and crystalline structure. Silicon carbide may be single crystal or polycrystalline. Silicon carbides include, but are not limited to, chemical vapor deposited silicon carbide, physical vapor deposited silicon carbide, reaction bonded silicon carbide, sintered silicon carbide, hot pressed silicon carbide and foamed silicon carbide. Typically, the silicon carbide is chosen from CVD silicon carbide, PVD silicon carbide, sintered silicon carbide and hot pressed silicon carbide. More typically, the silicon carbide is chosen from CVD silicon carbide and PVD silicon carbide. Most typically, the silicon carbide is CVD silicon carbide. The CVD silicon carbide typically is β-cubic silicon carbide.

Any suitable method may be used to modify the surface of the ceramic articles as long as the method provides the desired surface roughness and edge radius. Such methods include, but are no limited to, machining, lapping, polishing, grinding, grit blasting, carbon dioxide blasting, etching, such as wet etching with acids and bases or plasma etching, ablation such as energetic ablation, oxidation, electric discharge machining, direct CVD, or forming coatings on the articles, such as by CVD, PVD and energy assisted CVD and PVD. Such coatings include, but are not limited to silicon nitride, silicon, silicon carbide, silicon dioxide or carbon. Combinations of the foregoing methods also may be used to provide the desired surface. Typically, the surfaces of the silicon carbide wafer holding article are smoothed using lapping, polishing, or oxidation. More typically, the surfaces of the silicon carbide wafer holding article are smoothed by oxidation to form a silicon dioxide layer on the silicon carbide followed by stripping with acid.

Typically the ceramic article is first machined. In general, machining macroscopically removes undesired surface features of the ceramic articles after they are formed such as, for example, by CVD or PVD, and shapes the articles for their desired functions. Conventional machining process may be used. Such processes include, but are not limited to, grinding, lapping, honing, ultrasonic machining, water jet or abrasive machining, laser machining, electrical discharge machining, ion beam machining, electron beam machining, chemical machining and electrochemical machining.

The processes of machining and smoothing the surface to provide the desired Ra and Rz(din) as well as the desired edge radius may be combined. Surface smoothing methods such as wet etching, lapping, polishing, grinding, electric discharge, laser ablation, e-beam ablation, X-ray ablation, microwave ablation and radiation energy ablation may be combined with machining. When the surface roughening methods are combined with the machining processes, minor experimentation may be done to modify the process parameters of machining and the methods of roughening the surface to provide the desired article.

CVD is used after machining. Ceramic materials which may be formed by CVD include, but are not limited to, silicon carbide, silicon nitride, synthetic diamond, carbon, titanium boride, titanium carbide, boron carbide, boron nitride and carbon nitride. Conventional deposition chambers and reactions precursors may be used. The deposition processes are performed in inert atmospheres such as argon, helium, neon, krypton, xenon, nitrogen and mixtures thereof. Flow rates for such inert gases during deposition are conventional. The deposition rates of the precursors are less than 5 microns/min, or such as from 0.005 microns/min to 1 micron/min. Such rates depend on the deposition chamber temperatures, pressures and flow rates or the precursors. Such parameters may be adjusted during deposition to obtain the desired deposition rates. For example, deposition chamber temperatures may range from 1200° C. to 1700° C., or such as from 1250° C. to 1600° C. Deposition pressures range from 100 torr to 400 torr, or such as 125 torr to 350 torr, or such as 150 torr to 250 torr. Conventional precursor flow rates may be used and varied during deposition to obtain the desired deposition rates.

Energetic ablation uses radiant energy or beams of electromagnetic waves or particles to modify the ceramic surface. Radiant energy ablation or heat treating typically is done in a conventional vacuum chamber. A vacuum is slowly created around the ceramic article. Pressures may range from $10^{-4}$ to $10^{-10}$ torr, or such as from $10^{-6}$ to $10^{-8}$ torr. Pressure is held constant while the ceramic is then ramped to temperatures of 1000° C. to 2000° C., or such as from 1200° C. to 1500° C. The ceramic article is held at a constant temperature and pressure from 2 to 10 hours, or such as from 4 to 8 hours. The ceramic is then slowly cooled and brought to atmospheric pressure and removed from the chamber. Cooling and pressure reduction is done over a period of 5 min to 60 min, or such as from 10 min to 30 min and leaving the ceramic in the chamber to cool to room temperature over 6 hr to 48 hrs, or such as from 12 hr to 24 hr.

Electromagnetic waves or particles include, but are not limited to, protons, neutrons, electrons, X-rays, lasers (high intensity optical radiation), electrical discharge machining (EDM), also known as electrical arc, and microwaves. Apparatus used to modify the surface generally includes a means for controlling and focusing a particular beam of energy onto the surface of the ceramic. The particular means employed to control and focus the beam depends upon the particular type of electromagnetic radiation used. Such apparatus are well known in the art.

In general, where an electromagnetic beam is generated by an electron beam, ion beam or electrical arc an electrical current flows to the article. The current may range from 5 mA to 100 mA, or such as from 10 mA to 80 mA. The energy delivered by the electromagnetic beam may be defined in terms of a power density, which is the average power surface of the ceramic. Average power densities may range from 1000 W/cm$^2$ to 5000 W/cm$^2$, or such as from 2000 W/cm$^2$ to 4000 W/cm$^2$ at a point on the surface of the article upon which the beam is directed. The peak power density of the electromagnetic beam may be from 5000 W/cm$^2$ to 10,000 W/cm$^2$ or such as from 5500 W/cm$^2$ to 8000 W/cm$^2$ as a point on the surface of the ceramic. The peak power density may be defined as a process setting where the barn is at its maximum focus (i.e. smallest spot size) at a given power setting. Dwell times for the electromagnetic beam may range from 0.1 msec to 5 msec, or such as from 0.5 msec to 2 msec.

Chemical treatments such as wet etching include the use of acids and bases to modify ceramic surfaces. Such acids include, but are not limited to aqueous acid solutions such as sulfuric acid, nitric acid, hydrochloric acid, hydrofluoric acid, phosphoric acid and combinations thereof. The concentrations of the acids used range from 20 wt % to 80 wt %, or such as from 65 wt % to 70 wt %. When two or more acids are mixed together, equal amounts of each are typically used. Etching is done for 30 min to 240 min, or such as from 60 min to 180 min. Etching is done at temperatures of 20° C. to 100° C. or such as from 30° C. to 85° C.

Bases include, but are not limited to, potassium hydroxide, sodium hydroxide, ammonia hydroxide and combinations thereof. Concentrated forms of the bases are used. Typically, molten bases are used to etch the article surfaces. Etching with molten bases involves temperatures of 500° C. to 1000° C.

Dry etching or plasma etching involves generating plasma to energize or dissociate reactive gas species that interact with and remove material from the surface of the ceramic. A plasma discharge is created by transferring energy into a low-pressure gas. Dry etching may be done at plasma temperatures of 1000° C. to 5000° C., or such as from 1500° C. to 3000° C. The article is typically at temperatures of 100° C. to 500° C. Energy sources include, but are not limited to, radio frequency energy, microwave energy and magnetic fields. Pressures typically range from $10^{-3}$ torr to $10^{-10}$ torr, or such as from $10^{-5}$ torr to $10^{-8}$ torr. Various types of plasma gases and mixtures may be used. Such gases include, but are not limited to, chlorine, fluorine, nitrogen trifluoride, hydrogen chloride, boron trichloride, sulfur hexafluoride, fluorocarbons, oxygen and inert gases such as argon, neon, krypton, helium and xenon. Etching time may range from 30 sec to 90 min, or such as from 60 sec to 60 min, or such as from 120 sec to 30 min.

Generally, one or more non-inert gases, such as chlorine, fluorine, nitrogen trifluoride, hydrogen chloride and oxygen, compose 10% to 50% by volume or such as 15% to 25% by volume of the plasma with the remainder one or more inert gases. Typically, etching is done with mixtures of chlorine, oxygen and one or more inert gases. More typically, etching is done with fluorine, oxygen and argon. The halogen gases compose from 10% by volume to 30% by volume with oxygen composing from 10% by volume to 30% by volume with the remainder one or more inert gases. Etching is typically done for 60 sec to 3 hr, or such as from 15 min to 2 hr, or such as from 30 min to 1 hr.

Another chemical treatment method used to modify silicon carbide surfaces is oxidation. The silicon carbide article is placed in a conventional open air furnace at temperatures of 800° C. to 2000° C. or such as from 1000° C. to 1500° C. Heating continues for 100 hr to 400 hr, or such as from 150 hr to 250 hr. To expedite the process additional oxygen may be pumped into the furnace. Alternatively, the method may be done in a closed furnace with oxygen pumped into the furnace. Typically pressures in a closed furnace range from 50 torr to 1 atmosphere. Oxidation in closed furnaces typically takes from 5 hr to 30 hr, or such as from 10 hr to 20 hr.

The silicon dioxide layer may range in thickness from 0.1 microns to 5 microns or such as from 0.3 micron to 2 microns on the article. The silicon dioxide layer is then stripped off using a concentrated mineral acid solution. Suitable acids include, but are not limited to, hydrochloric acid, sulfuric acid, nitric acid, hydrofluoric acid, phosphoric acid and mixtures thereof. Typically hydrofluoric acid is used. Stripping is done at temperatures of 20° C. to 90° C.

When the silicon dioxide is removed, rough surface features and sharp peaks which the silicon dioxide coats, are removed as well. Removal of the silicon dioxide layer provides a smooth surface having the desired surface features.

Lapping and polishing may be done using conventional apparatus, such as with various lapping apparatus and polishing pads. When lapping plates are used, the plates turn at surface speeds of 300 m/min to 3000 m/min or such as from 600 m/min to 2500 m/min. Lapping and polishing are done at pressures of 1 psi to 15 psi, or such as from 1 hr to 10 hrs.

Lapping and polishing may be done with slurries, pastes and dry particles. Various types of particles may be used as well as particle sizes. Lapping and polishing may be done in multiple steps of varying particle sizes to achieve the desired surface roughness.

Chemical mechanical polishing may be done with particles having the formula $AO.xZ_2O_3$, wherein A is at least one divalent cation, Z is at least one trivalent cation and $0.01 \leq x \leq 100$. Cations include, but are not limited to, magnesium, iron (II), zinc, manganese, nickel, calcium and mixtures thereof. Z cations include, but are not limited to, aluminum, iron (III), chromium, titanium and mixtures thereof. Such particles have a specific area of 5 m$^2$/g to 200 m$^2$/g and a mean crystalline diameter of 5 nm to 500 nm and a mean aggregate particle diameter of 10 nm to 5000 nm. The Zeta potential may be positive, zero or negative. Typically the Zeta potential of the slurries are greater than or equal to +10 mV or less than or equal to −10 mV. The aqueous slurry includes particles in amounts of 0.1 wt % to 10 wt %. In addition to the particles, the slurry also may include oxidizing and reducing agents such as hydroxylamine compounds ammonium persulfate, hydrogen peroxide, polyelectrolytes and organic acids. Chelating agents as well as surfactants, stabilizers, suspending agents, buffers and lubricants also may be included. Additional cations also may be included such as, but not limited to, zirconium, copper, cobalt, lithium and rare earth cations.

Other abrasive particles which may be used include, but are not limited to, diamond, boron carbide, boron nitride, carbon nitride, silicon carbide, silicon nitride and mixtures thereof. Particle sizes may range from 0.005 microns to 30 microns, or such as from 0.05 microns to 20 microns, or such as from 0.5 microns to 10 microns. When diamond paste is used the particles sizes may range from 2 microns or less, typically 1 micron or less. Such abrasive particles may compose 1 wt % to 30 wt % of slurries. Conventional additives such as chelating agents, buffers and surfactants may be included in the slurries in conventional amounts.

Other forms of abrasive treatment include, but are not limited to, fixed abrasive grinding and grit blasting, such as sand blasting. Fixed abrasive grinding typically involves using diamond, silicon carbide and other abrasives which have a Mohs hardness of 9 and higher. Combinations of such materials also may be used. The abrasive may be in particle form or in the form of a grinding wheel such as a diamond wheel. The surface speed of the wheel is at least 1000 m/min., or such as from 2000 m/min to 10,000 m/min. Particles are applied at pressures of 10 psi to 100 psi, or such as from 20 psi to 80 psi. Conventional grinding apparatus may be used.

When grit blasting is used, conventional sand blasting apparatus, particle blast apparatus and blast cabinets may be used. Abrasives include, but are not limited to, diamond, silicon carbide, silicon nitride, boron nitride, boron carbide and combinations thereof. Abrasives are applied to the surface of the articles at pressures of 10 psi to 500 psi, or such as from 25 psi to 150 psi. Such pressures are applied until the desired surface is obtained.

Coatings of materials also may be used to provide the desired surface roughness. Such coatings include, but are not limited to, silicon carbide, silicon, silicon nitride, silicon dioxide and carbon. Such coatings may be deposited on the ceramic article surfaces by CVD or PVD. Conventional reactants may be used to form the coatings. Deposition temperatures and pressures may vary depending on the type of coating. Typically, furnace temperatures may range from 1000° C. to 1500° C., or such as from 1200° C. to 1400° C. Furnace pressures may range from 20 torr to 760 torr, or such as from 80 torr to 125 torr. Coating deposition rates may range from 0.01 microns/min to 5 microns/min or such as from 0.5 microns/min to 3 microns/min. Coating thicknesses may range from 0.01 microns to 10 microns, or such as from 0.1 microns to 5 microns.

The methods described above are exemplary of processes which enable the formation of silicon carbide wafer holding articles which may be used to process wafers having reduced slip as well as an improved balance between sticktion and float.

Any type of semiconductor wafer may be processed in the wafer holding apparatus. Typically, the semiconductor wafers are composed of materials which include, but are not limited to, silicon, sapphire, gallium arsenic, or silicon carbide. More typically, the semiconductor wafers are composed of silicon. One or more wafers may be processed simultaneously. The wafers rest in the wafer holding apparatus such that the smoothed surface of the wafer holding apparatus contacts from 5% to 80% of the wafer surface, or such as from 20% to 70% of the wafer surface to reduce slip and balance sticktion and float. Further, the surface parameters described above provide no sharp features which may encourage slip formation. Typically the backside of the wafer rests on the wafer holding article, which is typically a susceptor ring. High temperatures during wafer processing typically cause the wafer to bow or form a convex backside near the center where the wafer is not supported by the wafer holding article. Although the degree of bowing is only a few microns, there is sufficient bowing which causes the wafer to rub against the edges of the wafer holding article on which it rests to cause damage to the wafer when the edges are rough. Such damage may be crystalline point defects, line defects and fractures. To prevent or reduce damage to the wafer during bowing, the edges of the wafer holding articles have an edge radius of 0.05 mm or more.

Figure 2:
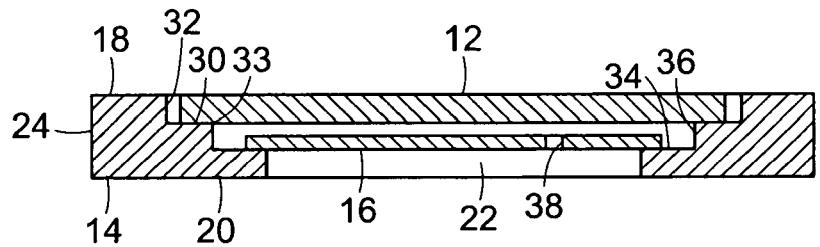
FIG. 2 is a cross-sectional side view of the susceptor and wafer of FIG. 2.
Figure 3:
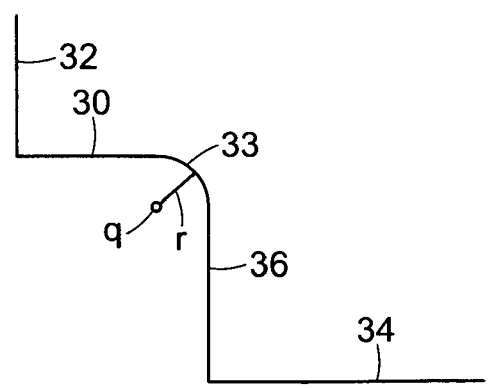
FIG. 3 is a cross-sectional side view of the rounded edges of the susceptor.

FIGS. 1, 2 and 3 are an example of one type of susceptor ring. As shown, the susceptor ring 10 is used to support a semiconductor wafer 12 during various fabrication processes. The susceptor 10 is formed of two basic components, a ring 14 and a blocker 16. The ring 14 is an annular member having upper and lower faces 18 and 20, respectively. The ring also includes two shoulders formed at the inner side wall 22, designated as wafer shoulder 26 and blocker shoulder 28. Wafer shoulder 26 opens onto the upper face 18, while the blocker shoulder 28 opens onto the wafer shoulder. The seat 30 and back wall 36 join at edge 33.

The wafer shoulder includes a planar seat 30 extending normal to the longitudinal axis of the ring, and a tubular back wall 32 coaxial with the longitudinal axis. The back wall 32 intersects the upper face 18. In a similar manner the blocker shoulder includes a seat 34 and a back wall 36, with the back wall 36 of the blocker shoulder intersecting the seat 30 to form edge 33. The radius "r" of edge 33, as measured from point "q", which is at the quarter point from the periphery of the edge, is 0.05 mm or more. As shown the seats provide support against gravity for the wafer and blocker, while the back walls provide support against gravity for the wafer and the blocker, while the back walls provide support against movement of the wafer or blocker laterally. In each case the diameter of the back wall is greater than that of the wafer or blocker, respectively, to permit these items to be easily inserted in, and removed from, the ring. Further, the seats are spaced a distance greater than the thickness of the blocker, such that there is a space between the bottom face of the wafer and the top face of the blocker, as shown in FIG. 2.

Wafer holders may be used in various wafer processing methods. Such methods include, but are not limited to, batch processing chambers, such as, high temperature annealing of wafers, high temperature diffusion, nitride deposition, single wafer processing chambers, such as, epitaxial silicon growth, chemical vapor deposition film growth, wafer annealing, high temperature diffusion and plasma etch.

The semiconductor wafers may be processed in the wafer holding articles in any suitable wafer processing chamber as well as any suitable method. Such methods include, but are not limited to, annealing, diffusion and nitride deposition, epitaxial growth, CVD film growth and plasma etch. Such processes modify the surface of the semiconductor wafer such that they may be used in electronic devices.

Examples of annealing include, but are not limited to, adiabatic heating, thermal flux and isothermal heating. Adiabatic involves application of energy provided by a pulse energy source (such as a laser, ion beam, electron beam) for a very short duration of 10 to $100 \times 10^{-9}$ seconds. This high intensity, short duration energy melts the surface of the semiconductor, to a depth of 1 to 2 microns. Thermal flux involves applying energy for $5 \times 10^{-6}$ to $2 \times 10^{-2}$ seconds. Thermal flux heating creates a substantial temperature gradient extending more than 2 microns below the surface of the wafer, but does not cause anything approaching uniform heating throughout the thickness of the wafer. Isothermal heating involves energy applied for 1 to 100 seconds to cause the temperature of the wafer to be uniform throughout its thickness at any given region.

Annealing processes may be done in conventional furnaces or in a rapid thermal annealing (RTA) system. The rapid thermal annealing of, for example, silicon may be carried out in any of a number of commercially available RTA furnaces in which wafers are individually heated by banks of high power lamps. RTA furnaces are capable of rapidly heating a silicon wafer from room temperature to 1200° C. in a few seconds. One such commercially available furnace is the model 610 furnace available from AG Associates (Mountain View, Calif.).

Epitaxial layers may be deposited or grown on a semiconductor wafer by many different processes well known in the art. Typically, growth of an epitaxial layer is achieved by chemical vapor deposition. Generally, chemical vapor deposition involves the introduction of volatile reactants, such as $SiCl_4$, $SiHCl_3$, $SiH_2Cl_2$ or $SiH_4$, with a carrier gas, such as hydrogen, into an epitaxial reactor. Although the process conditions may vary, in the case of monocrystalline layer deposition the temperature generally ranges from 1080° C. to 1150° C. In addition, the environment in which the deposition occurs is typically free of particulate contaminants.

Film forming on a semiconductor wafer may be done by thermal chemical vapor deposition. Typically the process is performed in a single-wafer deposition chamber. For example, in the deposition chamber, a hexachlorodisilane source gas is mixed with an oxidation source gas such as nitrous oxide to form a silicon oxide film. Alternatively, the hexachlorodisilane source gas is mixed with a nitridation source gas such as ammonia to from a silicon nitride film. Alternatively, the hexachlorodisilane source gas is mixed with an oxidation source gas such as nitrous oxide and a nitridation source gas such as ammonia to form a silicon-oxynitride film. The films are formed in the chamber with total pressure from 10 torr to 350 torr and with a temperature ranging from 500° C. to 800° C. The films are formed with deposition rates of 45 Å/min to 2000 Å/min. The films formed using hexachlorodisilane may have thicknesses of less than 300 Å and greater than 10 Å.

The modified semiconductor wafers may be measured for slip using any suitable method known in the art. Measuring slip is not method dependent. One method used in the industry is to measure and record depolarization of incident polarized light after its transmission through the wafer. This may be done with a depolarization imager such as an SIRD™ scanning infrared depolarization tool. Another method of measuring slip in the industry is by stationary beam technology (SBT), which is a laser-based inspection technique. This may be done by using a surface inspection system such as a Surfscan® SP1 unpatterned surface inspection system.

The following examples further illustrate the invention, but are not intended to limit the scope of the invention.

EXAMPLE 1

Figure 4:
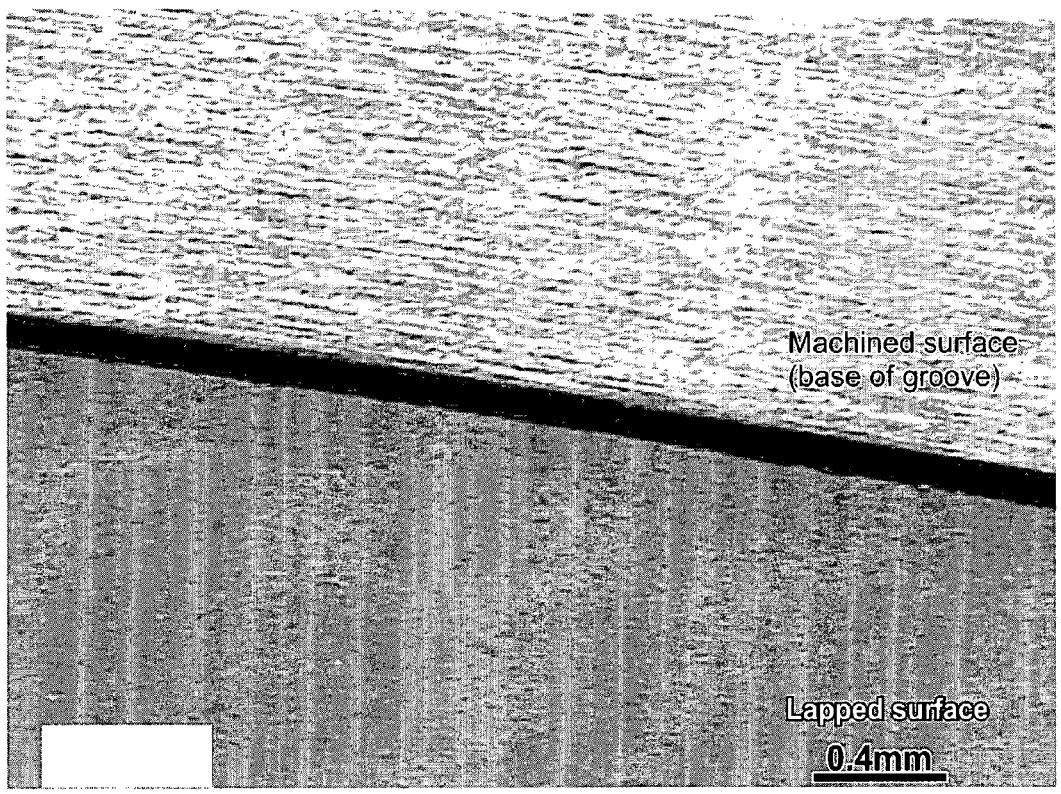
FIG. 4 is a photograph at 30× of machined and lapped silicon carbide surfaces.

A CVD silicon carbide susceptor ring was machined to a surface roughness of Ra=0.8 microns using a conventional grinding apparatus. The surface roughness was measured using a contact profilometer. The machining was done with a diamond wheel initially having a 150 grit followed by a diamond wheel having a 320 grit. Grinding was done at a rate of 1750 rpm for 9 hours. A photograph of the surface of the susceptor was taken. The top portion of FIG. 4 shows a 30× magnification of a portion of the machined surface of the susceptor. FIG. 4 shows the characteristic grooves and ridges produced by conventional machining.

The susceptor ring was then lapped using a Pellon Pad™ lapping pad using diamond paste with a particle size of 4 microns to 8 microns. Lapping was done for 2 hours at a surface speed of 600 m/min.

A photograph of a portion of the surface of the susceptor was then taken. The lower portion of FIG. 4 shows a 30× magnification of the lapped susceptor. The grooves and ridges characteristic of conventional machining were removed. A smoother surface was obtained.

The surface roughness was measured using a contact profilometer. The Ra value was determined to be 0.1 microns and the Rz(din) was determined to be 1 micron. The lapping method provided a surface with a lower Ra value than the conventional machining process.

The susceptor ring was then placed in a wafer boat and a semiconductor wafer was placed in the susceptor ring. The wafer boat was then placed in a conventional CVD furnace. The furnace was heated to a temperature of 1100° C. and an inert argon and hydrogen atmosphere was created as for epitaxial film formation. The wafer boat with the wafer was heated in the furnace for 6 hrs. The furnace was then cooled to room temperature, and the wafer boat with the susceptor ring and the wafer were removed from the furnace.

Stationary beam technology using the Surfscan® SP1 was used to measure the slip. The measurements showed no slip. Thus, the lapping method provided a susceptor which prevented slip.

EXAMPLE 2

A CVD silicon carbide susceptor ring is machined to a surface roughness of Ra=0.8 microns using a conventional grinding apparatus and method as described in Example 1. The surface roughness is measured using a contact profilometer.

The susceptor ring is then lapped using a Pellon Pad™ lapping pad using diamond paste with a particle size of 4 microns to 8 microns. Lapping was done for 2 hours at a surface speed of 1200 m/min. The susceptor was then polished for 3 hours using a diamond paste having a particle size of 2 microns to 4 microns. The Ra is expected to be less than 0.05 microns and the Rz(din) is expected to be less than 0.5 microns, as measured with a contact profilometer.

The susceptor ring is then placed in a wafer holding apparatus and a semiconductor wafer is placed in the susceptor ring. The apparatus is then placed into a CVD furnace with an inert argon atmosphere. The temperature of the furnace is raised from room temperature to 1100° C. The apparatus is heated in the furnace for 10 hrs. The furnace is then cooled to room temperature. When the wafer holding apparatus reaches room temperature, it is removed from the furnace. The silicon wafer is removed from the apparatus, and the amount of slip is determined. No measurable slip is expected.

EXAMPLE 3

A CVD silicon carbide susceptor ring is machined to a surface roughness of Ra=0.8 microns using a conventional grinding apparatus as described in Example 1. The surface roughness is measured using a contact profilometer.

The susceptor ring is then lapped using a Pellon Pad™ lapping pad using diamond paste with a particle size of 4 microns to 8 micron. Lapping is done for 3 hours at a surface speed of 1500 m/min. The susceptor is then polished for 4 hours using a diamond paste with particles having a size range of 0.25 microns to 1 micron. The Ra is expected to be 0.005 microns and the Rz(din) is expected to be 0.05 microns. The edge radius of the susceptor is expected to be greater than 0.1 mm.

The susceptor is then placed in a wafer boat. A silicon semiconductor wafer is placed in the susceptor boat, and the boat is then placed in a furnace. The furnace is provided with an inert atmosphere of argon and hydrogen. The furnace is heated to 1200° C. and the boat remains in the furnace for 10 hours. The temperature of the furnace is allowed to cool to room temperature. After the boat with the susceptor ring reaches room temperature, the slip is measured using stationary beam technology using a Surfscan® SP1. No measurable slip is expected.

EXAMPLE 4

A CVD silicon carbide susceptor ring was machined according the same procedure as in Example 1 to achieve an Ra=0.8. The susceptor was then placed into a standard thermal open air furnace containing 20% oxygen. The temperature of the furnace was raised to 1000° C. and the pressure was maintained at 1 atmosphere. The susceptor was heated in the furnace for 12 hours to produce a silicon dioxide layer on the surface of the susceptor 0.1 microns thick.

The susceptor was then placed in a wafer boat. A semiconductor wafer is placed in the susceptor and the boat was then placed into a furnace with an inert argon and hydrogen atmosphere. The furnace was heated to 1200° C. The boat was heated in the furnace for 10 hours. The temperature of the furnace was then allowed to cool to room temperature. After the boat with the susceptor ring and wafer reached room temperature, the slip was measured by stationary beam technology using a Surfscan® SP1. No measurable slip was detected.

EXAMPLE 5

A CVD silicon carbide susceptor ring was machined to a Ra=0.8 as described in Example 1. The susceptor ring was then placed in a standard thermal open air furnace to produce a 0.8 microns thick layer of silicon dioxide over the ring's surface.

The temperature of the open air furnace was maintained at 1100° C. for 200 hrs to produce the silicon dioxide layer over the surface of the susceptor ring. The furnace was then cooled to ambient temperature. When the susceptor ring cooled, it was immersed in a 1N hydrofluoric acid solution for 30 min to strip the silicon dioxide layer from the susceptor. The temperature of the hydrofluoric acid solution was at 30° C. during stripping.

The surface roughness of the susceptor was measured with a contact profilometer. The Ra was measured to be 0.1 microns and the Rz was measured to be 1 micron.

The susceptor ring was placed in a wafer boat and a silicon semiconductor wafer was placed in the ring. The boat was then placed into a furnace and heated to a temperature of 1050° C. The boat was left in the furnace for 5.5 hrs in an atmosphere of argon and hydrogen. After 5.5 hours the furnace was cooled to room temperature. When the boat reached room temperature, it was removed from the furnace. The wafer was removed from the boat and the amount of slip was measured using a Surfscan® SP1 unpatterned surface inspection system. The measurements showed no measurable slip.

EXAMPLE 6

A sintered silicon carbide susceptor is machined to a surface roughness of Ra=1 micron using a conventional machining apparatus. The machining is done by the same method as described in Example 1. The susceptor is then polished using a polishing pad and diamond particles having an average particle size of 0.5 microns to 1 micron. Polishing is done over 5 hours with a surface speed of 2400 m/min.

After the susceptor is polished, it is placed in a conventional inductively coupled plasma reactor. The temperature of the plasma is maintained at 1400° C. with a pressure of $10^{-5}$ torr during etching. Hydrogen chloride gas is introduced into the chamber at a rate of 1000 m/min. Etching is done for 60 sec. The Ra is expected to be less than 0.5 microns and the Rz(din) is expected to be less than 5 microns. The radius of the edge is expected to be 0.5 mm. Surface measurements are done with an optical profilometer.

The susceptor containing a silicon wafer is then placed in a silicon carbide wafer boat. The wafer is then annealed in a furnace with a hydrogen atmosphere at 1200° C. for 1 hr. The wafer is then annealed in a dry oxygen atmosphere for 1 hr. at 1200° C. The furnace is allowed to cool to room temperature. After the wafer cools to room temperature it is removed from the susceptor. The wafer is not expected to show any slip as measured by either an SIRD™ or a Surfscan® SP1.

EXAMPLE 7

A sintered silicon carbide susceptor ring is machined to a surface roughness of Ra=2 microns using a conventional grinding apparatus. Grinding is done by the same method as in Example 1 except that grinding is done for 6 hours instead of 9.

The susceptor is placed in a helicon plasma etch reactor. The temperature of the reactor is held at 1200° C. with a pressure of $10^{-5}$ torr during etching. Nitrogen fluoride is fed into the reactor at a flow rate of 500 ml/min as a source of fluorine gas. Etching is done for 30 min. The reactor is then allowed to cool to room temperature and when the susceptor reaches room temperature it is removed from the chamber.

The surface of the susceptor is then treated with a mixture of mineral acids containing 50 wt % hydrofluoric acid and 50 wt % nitric acid. The susceptor is immersed in a bath of the acid mixture for 20 sec. The temperature of the solution is 35° C. The susceptor is expected to have an Ra of 0.5 microns and an Rz(din) of 3 microns. The edge radius is expected to be 0.1 mm.

A silicon wafer is placed on the susceptor. They are placed in a furnace with an argon atmosphere and heated for 10 hr at 1400° C. The temperature in the furnace is reduced to room temperature. When the susceptor and wafer reach room temperature, they are removed from the furnace. The wafer is expected to show no measurable slip by using a Surfscan® SP1 and an SIRD™.

EXAMPLE 8

A CVD silicon carbide susceptor ring is machined by the same method as described in Example 1. The susceptor ring is then placed in a helicon plasma reactor. Hydrogen gas is added to the reactor at a flow rate of 50 ml/min and chlorine gas is added to the reactor at a rate of 300 ml/min. Neon gas is added to the chamber at a rate of 100 ml/min to provide an inert atmosphere in the reactor. The temperature in the reactor is held at 1500° C. with a pressure of $10^{-8}$ torr. Etching is done over 60 min. The susceptor is expected to have an Ra of 0.5 microns and an Rz(din) of 3 microns. The edge radius is expected to be 0.25 mm.

The susceptor with a silicon wafer is placed into a reactor which has a hydrogen atmosphere. The temperature of the reactor is 1300° C. The wafer is treated for 3 minutes. The surface of the wafer is then etched with 65% by volume of gaseous hydrogen chloride. The pressure in the reactor is at 2 torr.

After the wafer is etched, silicon layers are grown on the wafer using dichlorosilane and hydrogen are the reactants. The reaction mixture is 60% by volume of dichlorosilane and 40% by volume of hydrogen. The temperature of the reactor is reduced to 1050° C. during silicon growth. The pressure is maintained at 2 torr. Growth rate is 0.2 to 0.3 microns per min.

When the wafer cools to room temperature, it is removed from the reactor. The wafer is expected to show no measurable slip defects using the SIRD™ or Surfscan® SP1 instruments.

EXAMPLE 9

A CVD silicon carbide susceptor ring is machined and lapped to a surface roughness of Ra=0.1 microns and an Rz(din)=1 micron as described in Example 1. A silicon wafer is then placed on the ring and both are placed in a single-wafer deposition chamber.

The deposition temperature for forming a film on the silicon wafer is 800° C. and the pressure in the chamber is 50 torr. The reactants are ammonia gas supplied at a rate of 50 ml/min and hexachlorodisilane supplied at a rate of 60 ml/min. Film deposition occurs at a rate of 0.2 to 0.3 microns per min.

After a silicon nitride film is formed on the silicon wafer, it is allowed to cool to room temperature in the chamber. No measurable slip is expected to be detected on the wafer using the SIRD™ or Surfscan® SP1 instruments.

EXAMPLE 10

A chemical vapor deposited silicon carbide susceptor ring was machined to a surface roughness of Ra=0.8 microns using a conventional grinding apparatus and method as described in Example 1. The surface roughness was measured using a contact profilometer.

The susceptor ring was next sandblasted using a silicon carbide powder with a mesh (grit) size of 400. The silicon carbide powder was blasted through a tungsten carbide nozzle with a diameter of ⅛ inch at a pressure of 100 psi. The entire surface of the susceptor ring was sandblasted until all machining marks were no longer visible on the surface and the surface had a uniform appearance. The entire sandblasting operation takes approximately 30 minutes to complete.

The surface roughness was measured using a contact profilometer and the average roughness was Ra=1.9 microns and Rz(din)=7.6 microns.

The susceptor ring was then placed in a wafer boat. A silicon wafer was placed on the susceptor ring and the boat was then placed into a furnace with an inert argon and hydrogen atmosphere. The furnace was heated to 1200° C. The boat was heated in the furnace for 10 hours. The temperature of the furnace was then allowed to cool to room temperature. After the boat with the susceptor ring and wafer reached room temperature, the slip was measured. No measurable slip was detected on the silicon wafer using the SIRD™ or Surfscan® SP1 instruments.

EXAMPLE 11

A chemical vapor deposited silicon carbide susceptor ring was machined to a surface roughness of Ra=0.8 microns using a conventional grinding apparatus and method as described in Example 1. The surface roughness was measured using a contact profilometer.

The susceptor ring was next sandblasted using a silicon carbide powder with a mesh (grit) size of 400. The silicon carbide powder was blasted through a tungsten carbide nozzle with a diameter of ⅛ inch at a pressure of 100 psi. The entire surface of the susceptor ring was sandblasted until all machining marks were no longer visible on the surface and the surface had a uniform appearance. The entire sandblasting operation takes approximately 30 minutes to complete.

The susceptor ring was next sandblasted using a silicon carbide powder with a mesh (grit) size of 1000. The silicon carbide powder was blasted through a tungsten carbide nozzle with a diameter of ⅛ inch at a pressure of 120 psi. The entire surface of the susceptor was sandblasted for about 20 minutes.

The surface roughness was measured using a contact profilometer and the average roughness was Ra=1.3 microns and Rz(din)=5.5 microns.

The susceptor ring was then placed in a wafer boat. A silicon wafer was placed on the susceptor ring and the boat was then placed into a furnace with an inert argon and hydrogen atmosphere. The furnace was heated to 1200° C. The boat was heated in the furnace for 10 hours. The temperature of the furnace was then allowed to cool to room temperature. After the boat with the susceptor ring and wafer reached room temperature, the slip was measured. No measurable slip was detected on the silicon wafer using the SIRD™ or Surfscan® SP1 instruments.

What is claimed is:

1. A method comprising:
    a) modifying one or more surfaces of a chemical vapor deposited silicon carbide wafer holding article to provide a chemical vapor deposited silicon carbide wafer holding article having an Ra of less than or equal to 3 microns and an Rz(din) less than or equal to 15 microns by forming a silicon dioxide layer on the one or more surfaces of the chemical vapor deposited silicon carbide wafer holding article by heating the article in an oxygen containing environment at temperatures of 1000° C. to 1500° C. for 150 hours to 250 hours followed by stripping the silicon dioxide layer from the one or more surfaces of the chemical vapor deposited silicon carbide wafer holding article;
    b) placing one or more semiconductor wafers in the chemical vapor deposited silicon carbide wafer holding article;
    c) placing the chemical vapor deposited silicon carbide wafer holding article with the one or more semiconductor wafers in a processing chamber; and d) processing the one or more semiconductor wafers to modify the one or more semiconductor wafers to form a modified semiconductor wafer having less than or equal to 50 slip defects.

2. A method comprising:

a) modifying a surface of a chemical vapor deposited silicon carbide wafer holding article to provide a chemical vapor deposited silicon carbide wafer holding article having an edge radius of 0.05 mm or more, an Ra of less than or equal to 3 microns and an Rz(din) less than or equal to 15 microns by forming a silicon dioxide layer on the one or more surfaces of the chemical vapor deposited silicon carbide wafer holding article by heating the article in an oxygen containing environment at temperatures of 1000° C. to 1500° C. for 150 hours to 250 hours followed by stripping the silicon dioxide layer from the one or more surfaces of the chemical vapor deposited silicon carbide wafer holding article;

b) placing one or more semiconductor wafers in the chemical vapor deposited silicon carbide wafer holding article;

c) placing the chemical vapor deposited silicon carbide wafer holding article with the one or more semiconductor wafers in a processing chamber; and d) processing the one or more semiconductor wafers to modify the one or more semiconductor wafers to form a modified semiconductor wafer having less than or equal to 50 slip defects.

3. The method of claim 1, wherein the chemical vapor deposited silicon carbide wafer holding article has an Ra of 0.1 microns to 0.001 microns and an Rz(din) of 1 micron to 0.005 microns.

4. The method of claim 1, wherein the silicon dioxide layer is 0.1 microns to 5 microns thick.

5. The method of claim 4, wherein the silicon dioxide layer is 0.3 microns to 2 microns thick.

6. The method of claim 1, wherein the silicon dioxide layer is striped with an acid.

7. The method of claim 6, wherein the acid is chosen from one or more of hydrochloric acid, sulfuric acid, nitric acid, hydrofluoric acid and phosphoric acid.

8. The method of claim 1, wherein the chemical vapor deposited silicon carbide is β-cubic silicon carbide.

* * * * *